United States Patent [19]
Tani et al.

[11] Patent Number: 5,254,439
[45] Date of Patent: Oct. 19, 1993

[54] LIGHT-SENSITIVE POLYMER, METHOD FOR PREPARING THE SAME AND METHOD FOR FORMING PATTERNS

[75] Inventors: Yoshiyuki Tani; Masayuki Endou; Kazufumi Ogawa, all of Kadoma; Yasuhisa Tanaka, Tokyo; Toshinobu Ishihara, Tokyo; Tohru Kubota, Tokyo, all of Japan

[73] Assignees: Matsushita Electric Industrial Co., Ltd.; Shin-Etsu Chemical Co., Ltd., Japan

[21] Appl. No.: 854,696

[22] Filed: Mar. 20, 1992

Related U.S. Application Data

[60] Division of Ser. No. 622,152, Dec. 3, 1990, Pat. No. 5,126,419, which is a continuation of Ser. No. 307,955, Feb. 9, 1989, abandoned.

[30] Foreign Application Priority Data

Feb. 9, 1988 [JP] Japan .................................. 63-27994

[51] Int. Cl.$^5$ ............................................... G03F 7/30
[52] U.S. Cl. .................................... 430/326; 430/270; 430/945
[58] Field of Search .................. 430/326, 945, 270; 528/14, 34

[56] References Cited

U.S. PATENT DOCUMENTS
4,761,464 8/1988 Zeigler .................................. 430/326

FOREIGN PATENT DOCUMENTS
63-197941 8/1988 Japan .................................. 430/270
64-49037 2/1989 Japan .................................. 430/942

Primary Examiner—Marion E. McCamish
Assistant Examiner—Janis L. Dote
Attorney, Agent, or Firm—Parkhurst, Wendel & Rossi

[57] ABSTRACT

There is disclosed a polymer having linear —Si—O—Si— bonds and —Si—Si—Si— bonds, or polysilane bonds that are greater than trisilane bonds, sensitive to far ultraviolet rays. The polymer is prepared by polymerizing a dichlorosiloxane alone or with at least one dichlorosilane in an inert solvent in the presence of sodium. The polymer undergoes oxidation with oxygen plasma to form $SiO_2$ resistant to oxygen dry etching, exhibits absorption peaks only in far ultraviolet, and is suitable for preparing a single layered resist or an upper resist of a two-layered system.

3 Claims, 4 Drawing Sheets

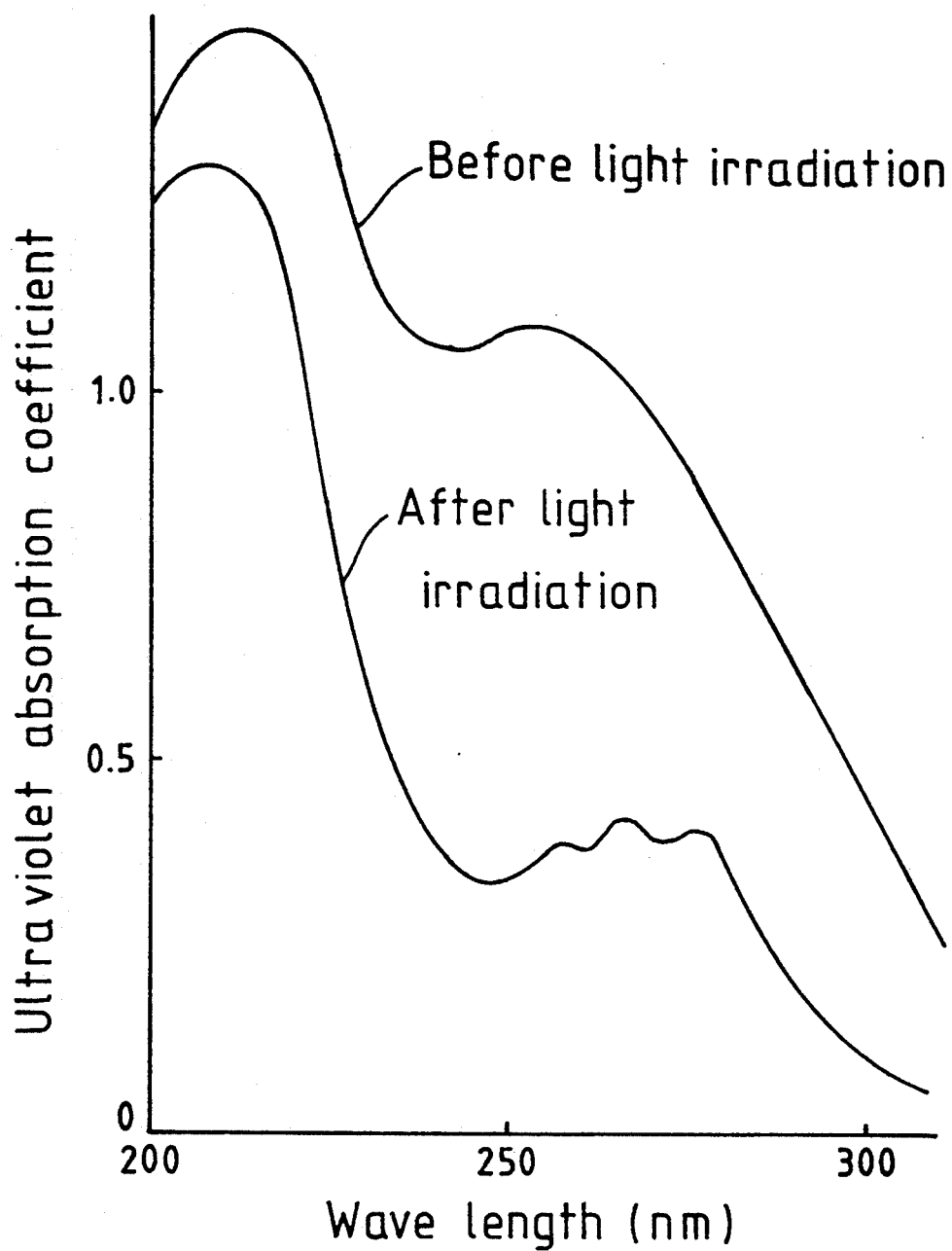

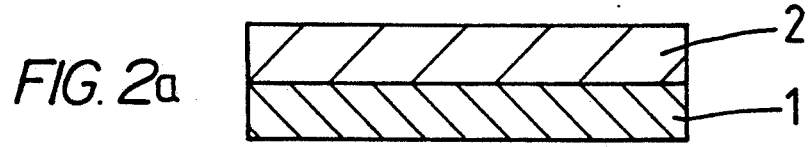
FIG. 2a
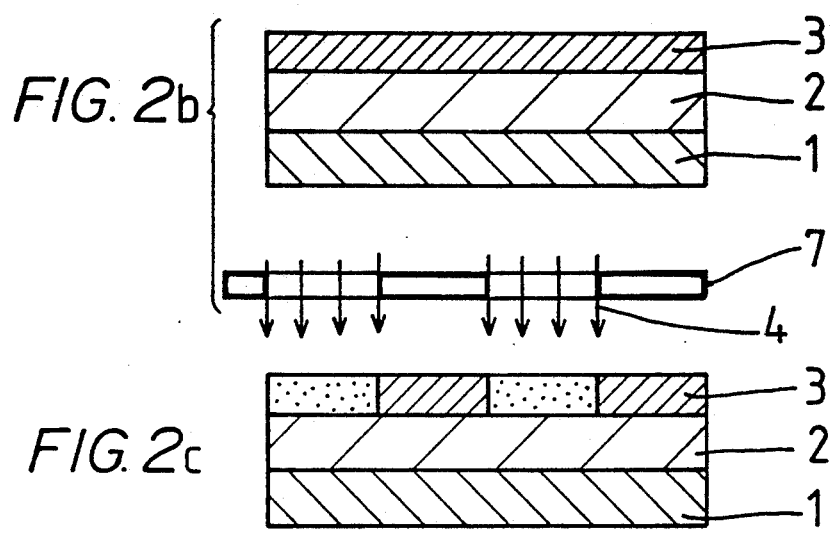
FIG. 2b
FIG. 2c
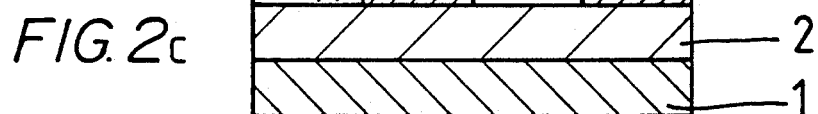
FIG. 2d
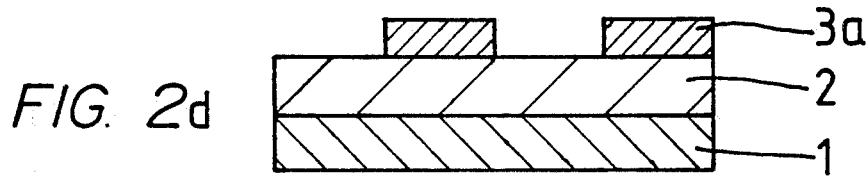
FIG. 2e
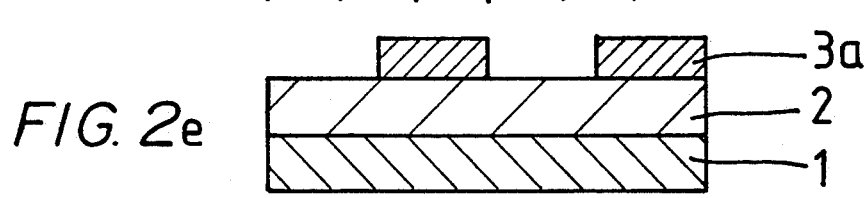
FIG. 2f
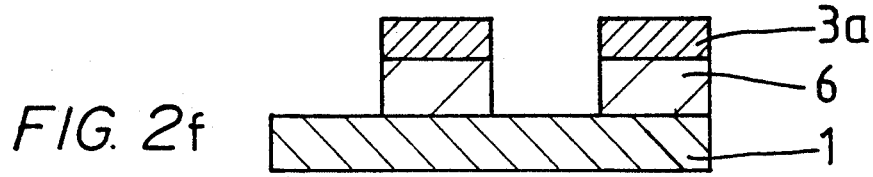

LIGHT-SENSITIVE POLYMER, METHOD FOR PREPARING THE SAME AND METHOD FOR FORMING PATTERNS

This is a division of U.S. patent application Ser. No. 07/622,152 filed Dec. 3, 1990 U.S. Pat. No. 5,126,419 which in turn is a continuation of U.S. patent application Ser. No. 07/307,955, filed Feb. 9, 1989, now abandoned.

BACKGROUND OF THE INVENTION

The present invention relates to a light-sensitive polymer sensitive to far ultraviolet rays and suitable as a resist material for forming fine patterns of, for instance, semiconductor elements, a method for preparing the same and a method for forming such a pattern using the light-sensitive polymer.

Organopolysilanes, whose main chain is completely composed of silicon atoms, strongly absorb ultraviolet rays at 300 to 350 nm and thus shown sensitivity to ultraviolet rays. Moreover, these compound undergo oxidation with oxygen plasma to thus be converted to $SiO_2$ resistant to oxygen dry etching. Therefore, it has been attempted to adopt them as the upper layer of a tow layered resist system in ultraviolet lithography techniques for manufacturing semiconductor elements or the like and its effectiveness has been proved empirically.

On the other hand, the dramatic increase in density and degree of integration of today's semiconductor elements strongly requires the development of a method for forming a pattern having a width of not more than 0.5 μm. To form such a fine pattern, it is believed that the lithography technique relying on the exposure to ultraviolet rays is no longer ineffective and as a result, lithographic techniques utilizing electron rays, X-rays or far ultraviolet rays have been investigated. However, the technique comprising exposure to electron rays makes the formation of fine patterns easy, but leads to low throughput; while with respect to the technique comprising exposure to X-rays, there has not been developed any high-output source of X-rays and it is not expected to further enhance the sensitivity of resist materials. On the contrary, in the technique comprising exposure to far ultraviolet rays, all the existing equipment for a stepper can be employed by simply changing the light source and optical systems, and high-output sources thereof such as excimer lasers have already been developed. Therefore, the best possible lithography technique is one comprising the use of far ultraviolet rays.

An important subject which has remained unsolved in the lithography technique using far ultraviolet rays is to develop a single layered resist or an upper resist for two layered resist systems. As in the ultraviolet lithography, the use of organopolysilanes has been investigated, but the absorption at 300 to 350 nm which is important in the ultraviolet exposure inhibits the bleaching effect and lowers the contrast of the resultant pattern. Thus, there has not yet been developed any such materials effective in the far ultraviolet exposure.

Under such circumstances, there has been a strong demand for the development of novel light-sensitive polymers which contain silicon atoms, strongly absorb only far ultraviolet rays and thus exhibit sensitivity to far ultraviolet rays.

SUMMARY OF THE INVENTION

Accordingly, an object of the present invention is to provide a resist material of a polymer which undergoes oxidation with oxygen plasma to form $SiO_2$ resistant to oxygen dry etching, which exhibits its absorption peaks only in far ultraviolet and which is suitable for preparing a single layered resist or an upper resist of two layered resist systems.

Another object of the present invention is to provide a method for preparing such a light-sensitive polymer.

The inventors of this invention have conducted various studies to achieve the aforementioned objects and have found that the objects can be attained by providing a light-sensitive polymer comprising, in the molecule, linear —Si—O—Si— bonds and —Si—Si—Si— bonds, or polysilane bonds more than trisilane. Thus, the inventors have completed the present invention.

According to one aspect of the present invention, there is provided a light-sensitive polymer which comprises, in the molecule, at least linear

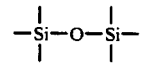

bonds and

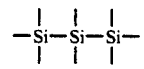

bonds, or poly-, more than tri-, silane bonds and which is sensitive to far ultraviolet rays whose wave length is around 250 nm.

According to another aspect of the present invention, there is provided a method for preparing such a light-sensitive polymer which comprises the step of polymerizing dichlorodisiloxane represented by the following general formula (II):

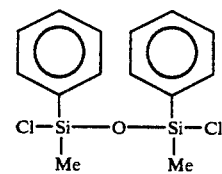

in an inert solvent in the presence of sodium; or copolymerizing a dichlorodisiloxane represented by the general formula (II) and dichlorosilanes represented by the following general formula (II):

(wherein $R_5$ and $R_6$ are the same or different and each represents a monovalent organic group) in an inert solvent in the presence of sodium.

According to a further aspect of the present invention, there is provided a method for forming patterns which comprises the steps of applying, to the surface of a substrate, an organic solution of a light-sensitive polymer which comprises, in the molecule, at least linear

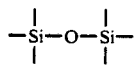

bonds and

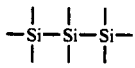

bonds, or polysilane bonds at least trisilane and which is sensitive to far ultraviolet rays; selectively exposing the light-sensitive polymer on the substrate to far ultraviolet rays and then developing the exposed polymer with an organic solvent to remove exposed portions thereof.

BRIEF EXPLANATION OF THE DRAWINGS

The present invention will hereinafter be explained in more detail with reference to the attached drawings, wherein;

FIGS. 1 and 4 are for ultraviolet absorption curves of an embodiment of the light-sensitive polymer of the present invention observed before and after irradiating it with excimer laser rays; and FIGS. 2a-2f and 3a-3c are schematic diagrams illustrating the steps of the method for forming patterns according to one embodiment of this invention.

DETAILED EXPLANATION OF THE INVENTION

Figure 3A:
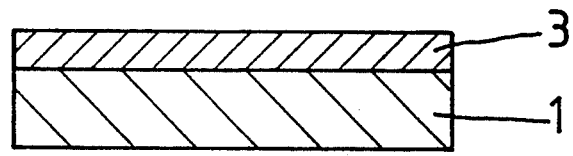

The light-sensitive polymer according to the present invention is characterized in that it comprises, in the molecule, at least linear

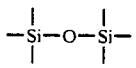

bond(s) and

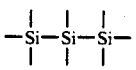

bond(s) and examples thereof include those represented by the following general formula (I):

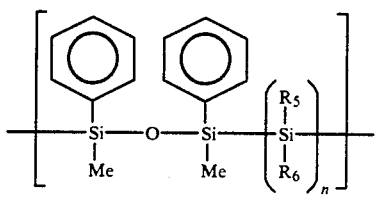

In the formula (I), $R_5$ and $R_6$ are the same or different and each represents a monovalent organic group, n being a positive integer. More specifically, the monovalent organic group may be a methyl, ethyl, propyl, isopropyl, n-butyl, n-hexyl, n-octyl, phenyl, tolyl or p-methoxyphenyl group etc.

The average molecular weight of the light-sensitive polymer of this invention desirably ranges from 1,000 to 1,000,000. This is because if it is less than 1,000, it is impossible to form the polymer into a film, while if it is more than 1,000,000, the polymer cannot dissolve in a solvent. Therefore, the molecular weight of the light-sensitive polymer should be limited to the foregoing range in order to use the polymer as a resist used in the lithography techniques.

The light-sensitive polymer of the present invention can be prepared by copolymerizing the aforesaid dichlorodisiloxane represented by the general formula (II) and at least one aforementioned dichlorosilane represented by formula (III) in an inert solvent in the presence of sodium.

In the foregoing method, the ratio of the compound (II) to the compound (III) used is preferably in the range of 1:1. to 4. Examples of the inert solvents include toluene, xylene, mesitylene, n-octane and decalin. The reaction is usually carried out at the atmospheric pressure in a nitrogen gas atmosphere in the presence of 1 to 1.2 mol. of sodium per mol. of the Si—Cl unit. The reaction temperature is preferably not less than the melting point of sodium, but the reaction also effectively proceeds at a temperature not more than the melting point of sodium if the reaction mixture is vigorously stirred.

In the above formula (III), examples of the groups $R_5$ to $R_6$ are the same as those listed above in connection with the formula (I).

The light-sensitive polymer of the present invention can also be obtained by polymerizing the dichlorodisiloxane represented by formula (II) in an inert solvent in the presence of sodium. In this homopolymerization, the same reaction conditions as those discussed above can be employed.

The light-sensitive polymer of the present invention shows strong sensitivity only to far ultraviolet rays due to the presence of bonds

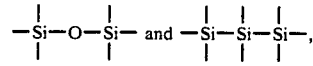

or poly-, at least tri-, silane bonds and it undergoes oxidation with oxygen plasma to form $SiO_2$, highly resistant to oxygen dry etching as in the case of organopolysilanes. Therefore, the light-sensitive polymer of the invention shows high resistance to the dry etching with oxygen plasma which is just required for such a resist pattern. Thus, the light-sensitive polymer can surely be applied as a resist material in the far ultraviolet lithography technique. It has been experimentally proven that the light-sensitive polymer provides ultrafine patterns of high contrast and good shape in high sensitivity.

The present invention will hereunder be described more specifically with reference to the following non-limitative working Examples.

EXAMPLE 1

Methylphenyl dichlorosilane (765 g; 4.0 mol.) and the same amount of diethyl ether were introduced into a four-necked flask of 2 liters volume equipped with a stirring machine, a reflux condenser, a thermometer and a dropping funnel, followed by stirring the mixture, dropwise adding 36 g (2.0 mol.) of water through the dropping funnel over five hours under nitrogen atmosphere, and then refluxing the mixture for an additional three hours. After refluxing the mixture, ether was distilled off and the starting material, methylphenyl dichlorosilane (184 g; 0.96 mol.) was recovered by distilling the reaction mixture in vacuo to obtain 220 g (0.67 mol.) of 1,3-dimethyl-1,3-diphenyl dichlorodisiloxane. Boiling Point=135°-138° C. /2 mmHg.

EXAMPLE 2

A dispersion of 15.2 g (0.66 mol.) of sodium in 250 ml of xylene was charged into a four-necked brown flask of 500 ml volume equipped with a stirring machine, a reflux condenser, a thermometer and a dropping funnel, followed by refluxing the dispersion, dropwise adding slowly, to the flask, a mixed solution of 1,3-dimethyl-1,3-diphenyl dichlorodisiloxane (49.1 g; 0.15 mol.) prepared in Example 1 and diphenyldichlorosilane (38.0 g; 0.15 mol.) through the dropping funnel and refluxing the mixture for 10 hours. After cooling the resulting mixture, the residual sodium was quenched with methanol, the mixture was washed twice with a saturated aqueous solution of ammonium chloride and twice with water and the xylene phase was separated and filtered. Xylene was removed from the xylene phase by distillation and the resultant residue was reprecipitated in tetrahydrofuran-isopropyl alcohol to obtain a polymer having the following repeating units as white powder (yield; about 25%).

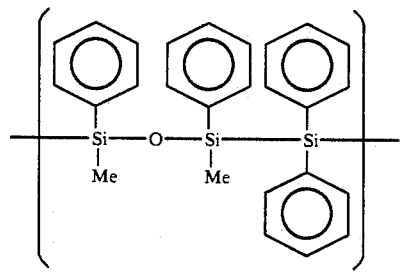

Melting Point; 110°-120° C.
Weight Average Molecular Weight ; 12,000
H-NMR spectra (CCl$_4$, $\delta$ ppm); −0.2-0.3 (m, Si—CH$_3$); 6.1-7.4 (m, ring protons)
IR spectra (cm$^{-1}$); 3060, 3040, 3020, 2970, 1435, 1265, 1255, 1130, 1110, 1100, 1030, 1000,
UV spectra ($\lambda$ max.); 253 nm The ultraviolet absorption curves of the polymer observed before and after irradiating it with KrF excimer laser rays of 248 nm are shown in FIG. 1. As seen from FIG. 1, the ultraviolet absorption decreases after irradiating with light, which clearly shows the occurrence of a photoreaction.

EXAMPLE 3

The polymer obtained in Example 2 was dissolved in toluene so that the concentration of the resulting solution was 10% to form a resist solution. In this respect, the solvent is not restricted to toluene so far as it can dissolve the polymer.

The method for forming a resist pattern using the polymer of the present invention will hereunder be explained with reference to FIG. 2. An underlying resist 2 (for instance, RG 3900B available from Hitachi Chemical Co., Ltd.) was applied to the surface of a substrate 1 of, for instance, a semiconductor with a rotary coater to form a resist film of 2.0 micron thick (see FIG. 2 (a)). In this connection, substances to be etched such as insulating films and metal films are often applied to the surface of the substrate 1. In addition, the materials for the underlying resist are not limited to a specific one so far as they can be etched by oxygen plasma. After heating the substrate to remove the solvent (at 240° C. for 20 minutes), the resist solution prepared above containing the light-sensitive polymer of the present invention was applied onto the underlying resist layer 2 with a rotary coater to form an upper resist layer 3 of 0.3 micron thick (see FIG. 2(b)). Likewise, the substrate was heated (130° C. for 20 minutes) to remove the solvent and then the upper resist layer 3 was selectively irradiated with pulses of KrF excimer laser rays 4 (248 nm) through a mask carrying a desired pattern (see FIG. 2(c)). Then, the exposed portions of the layer 3 was developed with ethanol to remove the same and to thus form a positive working upper resist pattern 3a (see FIG. 2(d)). In this connection, any developers may be used so far as they are capable of dissolving out only the exposed portions. Finally, the underlying resist layer 2 was selectively etched by oxygen plasma through the resist pattern 3a serving as a mask to transfer the pattern to the underlying resist layer 2 (see FIG. 2 (e)) and thus the desired resist pattern 6 was formed (FIG. 2 (f)). At this stage, an oxide film (SiO$_2$) was formed on the surface of the upper resist layer and thus the resistance to oxygen dry etching of the layer was enhanced. As a result, the resultant patterns showed high contrast correctly corresponding to the mask design (0.4 micron) without causing the reduction in the thickness of the resist.

EXAMPLE 4

Figure 3B:
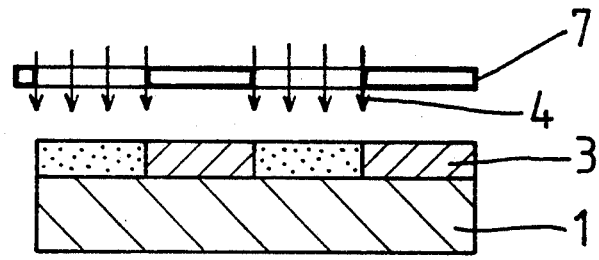
Figure 3C:
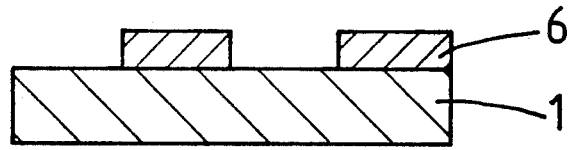

In this Example, the light-sensitive polymer obtained in Example 2 was used to form a single layered resist. The method for forming patterns will be explained below with reference to FIG. 3. 20% solution of the polymer in toluene (resist solution) was applied onto the surface of a substrate 1 of, for instance, a semiconductor with a rotary coater to form a resist film 3 of 1.0 micron thick (see FIG. 3 (a)). After heating the substrate (at 130° C. for 30 minutes) to remove the solvent, the resist layer 3 was irradiated with pulses of KrF excimer laser rays 4 through a mask carrying a desired pattern (see FIG. 3 (b)). Finally, the resist layer 3 was developed with ethanol to remove the exposed portions of the layer and to thus form a positive working pattern 6 (see FIG. 3 (c)). The resultant pattern showed high contrast correctly corresponding to the mask design (0.4 micron), though the sensitivity thereof was inferior to that of the two layered resist process.

EXAMPLE 5

The same procedures as in Example 2 were repeated except that a mixed solution of 1,3-dimethyl-1,3-diphenyl dichlorodisiloxane (0.15 mol.), diphenyldichlorosilane (0.075 mol.) and methylphenyldichlorosilane (0.075 mol.) was used instead of the mixed solution of Example 2 to obtain a light-sensitive polymer having the following repeating units in an yield of about 20%.

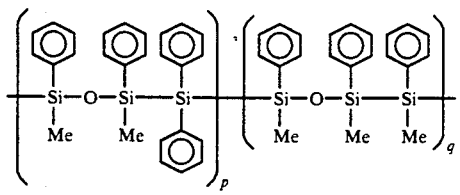

Figure 4:
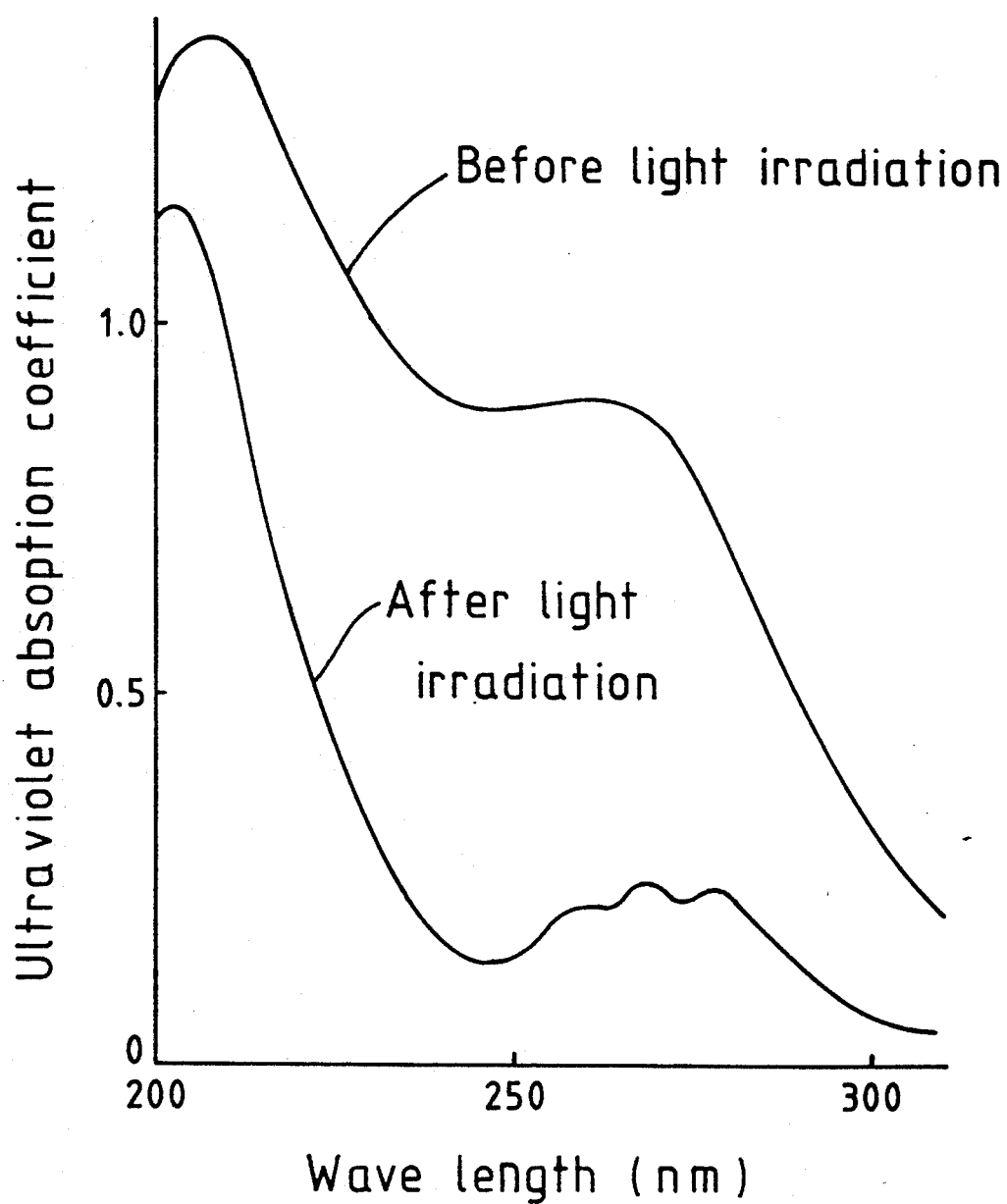

The ultraviolet absorption curves of the light-sensitive polymer observed before and after irradiating it with KrF excimer laser rays are shown in FIG. 4. FIG. 4 clearly indicates that a photoreaction was surely occurred.

EXAMPLE 6

The same procedures as in Example 3 were repeated except for using the polymer prepared in Example 5. As a result, patterns having high contrast correctly corresponding to the mask design (0.4 micron) were obtained in a sensitivity higher than that observed in Example 3.

EXAMPLE 7

The same procedures as in Example 4 were repeated except for using the polymer prepared in Example 5. As a result, patterns having high contrast correctly corresponding to the mask design (0.4 micron) were obtained in a sensitivity higher than that observed in Example 4.

EXAMPLE 8

The same procedures as in Example 2 were repeated except that a weight of diphenyl dichlorosilane of a mixed solution was 76.0 g (0.30 mol.) instead of the mixed solution of Example 2 to obtain white powder having the following repeating units in an yield of about 18%.

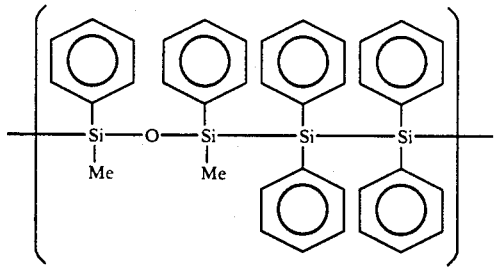

Melting Point; 120°-130° C.
Weight Average Molecular Weight; 13,000
H-NMR spectra (CCl$_4$, $\delta$ ppm); $-0.5$–$0.2$ (m, Si—CH$_3$); 6.0–7.3 (m, ring protons)
IR spectra (cm$^{-1}$); 3060, 3040, 3020, 2970, 1435, 1265, 1255, 1130, 1110, 1100, 1030, 1000,
UV spectra ($\lambda$ max.); 258 nm

EXAMPLE 9

The same procedures as in Example 2 were repeated except that a mixed solution of 49.1 g (0.15 mol.) of 1,3-dimethyl-1,3-diphenyldichlorosiloxane, and 29.6 g (0.15 mol.) of cyclohexylmethyldichlorosilane was used instead of the mixed solution of Example 2 to obtain white powder having the following repeating units in an yield of about 14%.

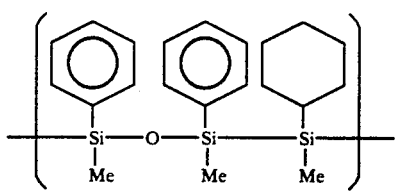

Weight Average Molecular Weight; 410,000
H-NMR spectra (CCl$_4$, $\delta$ ppm);
$-0.4$–$2.0$ (m, Si—CH$_3$ and

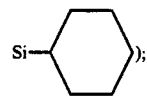

6.6–7.5 (m, ring protons)
IR spectra (cm$^{-1}$); 3060, 3040, 2920, 2850, 1450, 1435, 1255, 1110, 1005, 1000
UV spectra ($\lambda$ max.); 251 nm As discussed above in detail, the light-sensitive polymer of the present invention makes it possible to simultaneously achieve high sensitivity and high resolution if it is used as an upper resist layer in a two layered resist process and to achieve high resolution by a simple process if it is used in a single layered process. Moreover, the polymer of the present invention shows sensitivity and resolution higher than those of the conventional organopolysilanes and, therefore, it is clear that the polymer has industrial value.

What is claimed is:

1. A method for forming fine patterns comprising the following steps:
 (a) forming a resist on a surface of a substrate, by applying an organic solution of a light-sensitive polymer comprising repeating units represented by the general formula:

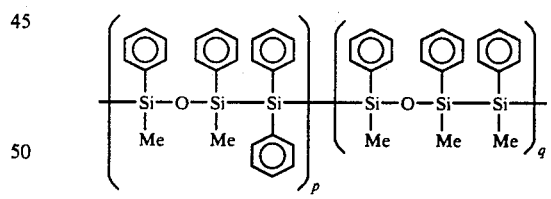

wherein Me represents a methyl group and p and q are each a positive integer, said polymer being sensitive to about 250 nm wavelength KrF excimer laser rays only and having a weight average molecular weight of 1,000 to 1,000,000;
 (b) selectively exposing the light-sensitive polymer on the substrate to far ultraviolet rays; and
 (c) developing the exposed polymer with ethanol.

2. The method for forming fine patterns as set forth in claim 1 wherein the resist is formed on another underlying resist on the surface of the substrate.

3. The method for forming fine patterns as set forth in claim 1 wherein the far ultraviolet rays of step (b) are provided by a KrF excimer laser.

* * * * *